(12) United States Patent
Manger et al.

(10) Patent No.: US 12,736,885 B2
(45) Date of Patent: Sep. 15, 2026

(54) ADAPTIVE OPTICAL ELEMENT FOR MICROLITHOGRAPHY

(71) Applicant: Carl Zeiss SMT GmbH, Oberkochen (DE)

(72) Inventors: Matthias Manger, Aalen-Unterkochen (DE); Markus Raab, Schillingsfuerst (DE); Alexander Vogler, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 274 days.

(21) Appl. No.: 18/188,895

(22) Filed: Mar. 23, 2023

(65) Prior Publication Data

US 2023/0229092 A1 Jul. 20, 2023

Related U.S. Application Data

(63) Continuation of application No. PCT/EP2021/077484, filed on Oct. 6, 2021.

(30) Foreign Application Priority Data

Oct. 8, 2020 (DE) ........................ 102020212742.5

(51) Int. Cl.
*G03F 7/00* (2006.01)

(52) U.S. Cl.
CPC ...... *G03F 7/70266* (2013.01); *G03F 7/70891* (2013.01)

(58) Field of Classification Search
CPC ............... G03F 7/70266; G03F 7/7085; G03F 7/70891; G03F 7/702; G03F 7/70258;
(Continued)

(56) References Cited

U.S. PATENT DOCUMENTS 6,513,939 B1 * 2/2003 Fettig .................. G02B 6/4214
359/848
10,684,466 B2 6/2020 Hakvoort et al.
(Continued)

FOREIGN PATENT DOCUMENTS

DE 102010030442 A1 12/2011
DE 102011077234 A1 12/2012
(Continued)

OTHER PUBLICATIONS

Japanese Office Action, with translation thereof, for corresponding JP Appl No. 2023-520338, dated Feb. 13, 2024.
(Continued)

*Primary Examiner* — Christina A Riddle
(74) *Attorney, Agent, or Firm* — Fish & Richardson P.C.

(57) ABSTRACT

An adaptive optical element for microlithography comprises at least one manipulator for changing the shape of an optical surface of the optical element. The manipulator comprises a one-piece dielectric medium which is deformable by applying an electric field, electrodes that are arranged in interconnection with the one-piece dielectric medium, and a voltage generator which is wired to the electrodes and configured to apply to the electrodes, firstly, a control voltage that serves to change a longitudinal extent of the dielectric medium and, secondly, an AC voltage that serves to heat the dielectric medium.

20 Claims, 4 Drawing Sheets

(58) Field of Classification Search

CPC .. G03F 7/70308; G03F 7/70316; G03F 7/705; G03F 7/70825; G03F 7/70883; G03F 7/709; G03F 7/70991; G03F 7/70233; G03F 7/70958; G03F 7/70275; G03F 7/20; G03F 7/70075; G03F 7/70225; G03F 7/70341; G03F 7/70966; G03F 7/70141; G03F 7/7015–70191; G03F 7/70325; G03F 7/70483–70541; G03F 7/7055–70583; G03F 7/70591–706; G03F 7/708; G03F 7/70808; G03F 7/70841; G03F 7/70858; G03F 7/70908; G03F 7/70941; G03F 7/7095; G03F 7/70975; G02B 5/0891; G02B 26/004; G02B 26/0825; G02B 26/0841; G02B 26/0858; G02B 5/1828; G02B 5/1838; G02B 5/1861; G02B 17/0647; G02B 27/0043; G02B 3/00; G02B 5/00; G02B 5/08; G02B 5/0816; G02B 7/1815; G02B 13/22; G02B 17/0652; G02B 17/0657; G02B 17/0812; G02B 17/0892; G02B 26/06; G02B 27/0025; G02B 7/185–188; G21K 1/062; G21K 2201/061; G21K 2201/064; G21K 2201/067; Y10S 359/90; B82Y 10/00; G03B 27/542; G01D 3/0365; G01K 5/00; G01K 7/16

USPC ......... 355/18, 30, 39, 44, 46, 52–55, 66–77; 250/492.1, 492.2, 492.22, 492.23, 493.1, 250/503.1, 504 R, 505.1; 359/224.1

See application file for complete search history.

(56) References Cited

U.S. PATENT DOCUMENTS

| | | | | |
|---|---|---|---|---|
| 2004/0070743 | A1 | 4/2004 | Hudyma et al. | |
| 2005/0190435 | A1 | 9/2005 | Shafer et al. | |
| 2006/0018045 | A1* | 1/2006 | Moeller | G02B 5/10 359/838 |
| 2006/0028703 | A1 | 2/2006 | Govil et al. | |
| 2007/0279757 | A1* | 12/2007 | Renders | G02B 26/005 359/665 |
| 2008/0291559 | A1 | 11/2008 | Tanaka et al. | |
| 2011/0235012 | A1 | 9/2011 | Fischer et al. | |
| 2011/0317741 | A1 | 12/2011 | Seefeld et al. | |
| 2013/0141707 | A1 | 6/2013 | Baer et al. | |
| 2015/0015864 | A1 | 1/2015 | Fischer et al. | |
| 2016/0379730 | A1 | 12/2016 | Dinger et al. | |
| 2017/0115576 | A1 | 4/2017 | Bittner et al. | |
| 2018/0164581 | A1 | 6/2018 | Hakvoort et al. | |
| 2018/0196253 | A1 | 7/2018 | Kwan et al. | |
| 2018/0314164 | A1 | 11/2018 | Dekkers et al. | |
| 2019/0310555 | A1 | 10/2019 | Baer et al. | |
| 2020/0073252 | A1 | 3/2020 | Juergens et al. | |
| 2020/0343440 | A1 | 10/2020 | Hilgers et al. | |
| 2022/0382166 | A1 | 12/2022 | Manger et al. | |
| 2023/0229091 | A1 | 7/2023 | Manger et al. | |
| 2025/0147375 | A1 | 5/2025 | Telfer et al. | |

FOREIGN PATENT DOCUMENTS

| | | | |
|---|---|---|---|
| DE | 10 2015 211 699 | A1 | 2/2016 |
| DE | 102015202676 | A1 | 8/2016 |
| DE | 10 2015 220 537 | A1 | 10/2016 |
| DE | 10 2015 213 275 | A1 | 1/2017 |
| DE | 10 2016 201 445 | A1 | 2/2017 |
| DE | 10 2017 203 647 | A1 | 9/2018 |
| DE | 10 2017 208 364 | A1 | 11/2018 |
| DE | 10 2020 212 743 | A1 | 4/2022 |
| EP | 1351087 | A2 | 10/2003 |
| EP | 3451397 | A1 | 3/2019 |
| JP | S62-230068 | A | 10/1987 |
| JP | H02-038774 | A | 2/1990 |
| JP | H0238775 | A | 2/1990 |
| JP | H04-077639 | A | 3/1992 |
| JP | H06104502 | A | 4/1994 |
| JP | 2001-013294 | A | 1/2001 |
| JP | 2004-262429 | A | 9/2004 |
| JP | 2004-363429 | A | 12/2004 |
| JP | 2008-040299 | A | 2/2008 |
| JP | 2011-221402 | A | 11/2011 |
| JP | 2012-504329 | A | 2/2012 |
| JP | 2013-533633 | A | 8/2013 |
| JP | 2016-046366 | A | 4/2016 |
| JP | 2018-522280 | A | 8/2018 |
| JP | 2018-534602 | A | 11/2018 |
| JP | 2001-013297 | A | 1/2019 |
| TW | 201222121 | A | 6/2012 |
| WO | WO 2018/162231 | A1 | 9/2018 |
| WO | WO 2019/122402 | A1 | 6/2019 |
| WO | WO 2022/029216 | A1 | 2/2020 |
| WO | WO 2022/023313 | A1 | 2/2022 |

OTHER PUBLICATIONS

Japanese Office Action, with translation thereof, for corresponding JP Appl No. 2023-520394, dated Mar. 19, 2024.

International Search Report and Written Opinion for corresponding PCT Appl No. PCT/EP2021/077484, dated Jan. 27, 2022.

German Office Action, with translation thereof, for corresponding DE Appl No. 10 2020 212 742.5, dated Mar. 31, 2022.

Pritchard et al., “Time-temperature profiles of multi-layer actuators,” Sensors and Actuators A 115 (2004) 140-145.

U.S. Appl. No. 18/188,814, filed Mar. 23, 2023, Matthias Manger.

Office Action in European Appln. No. 21790116.4, mailed Apr. 28, 2025, 8 pages.

Office Action in Taiwanese Appln. No. 110137129, mailed on May 13, 2025, 23 pages (with English translation).

Relative Permittivity—the Dielectric Constant Common materials and their relative permittivity (11 pages), retrieved on Dec. 16, 2024. https://www.engineeringtoolbox.com/relative-permittivity-d_1660.html.

Piezo Materials and Properties, Piezo Material Overview: *Differences between 5A, 5J, & 5H.* (11 pages), retrieved on Dec. 16, 2024. Piezo Material Properties |0 piezo.com.

Andleeb K. et al., Fabrication of Textured 0.685(Na0.5Bi0.5)TiO3—0.065BaTiO3—0.25SrTi)3 Electrostrictive Ceramics by Templated Grain Growth Using NaNbO3 Templates and Characterization of Their Electrical Properties, *Crystals* 2024, 14, 861. Published Sep. 30, 2024.

* cited by examiner

Fig. 1
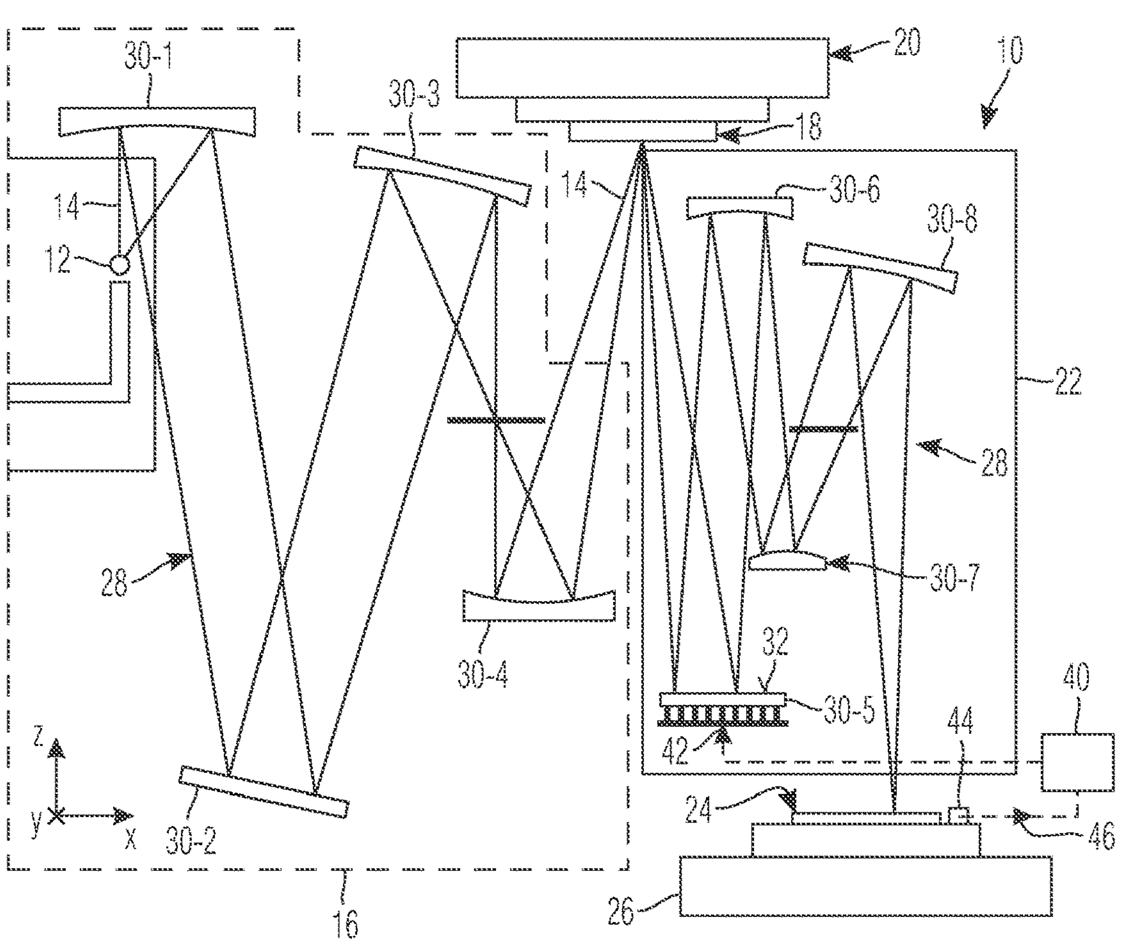
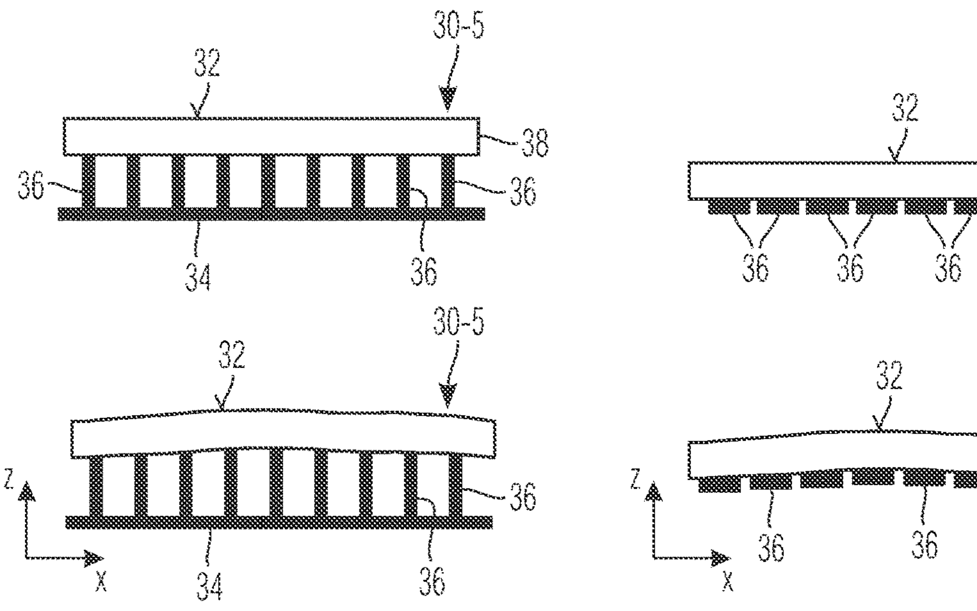
Fig. 2
Fig. 3

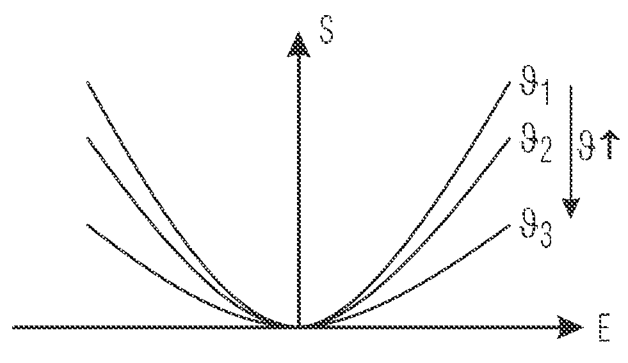
Fig. 4
S
$\vartheta_0$
$\vartheta$
Fig. 5
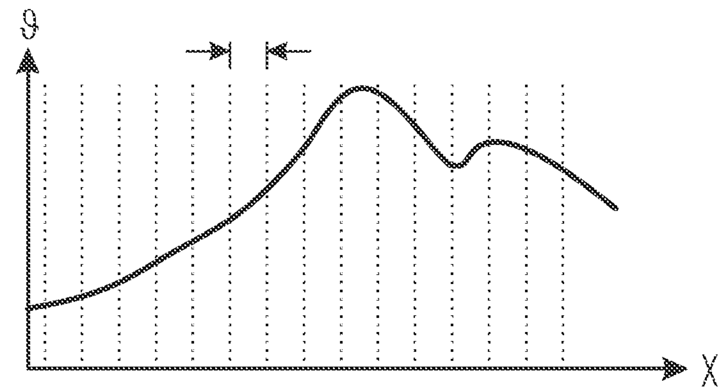
Fig. 6
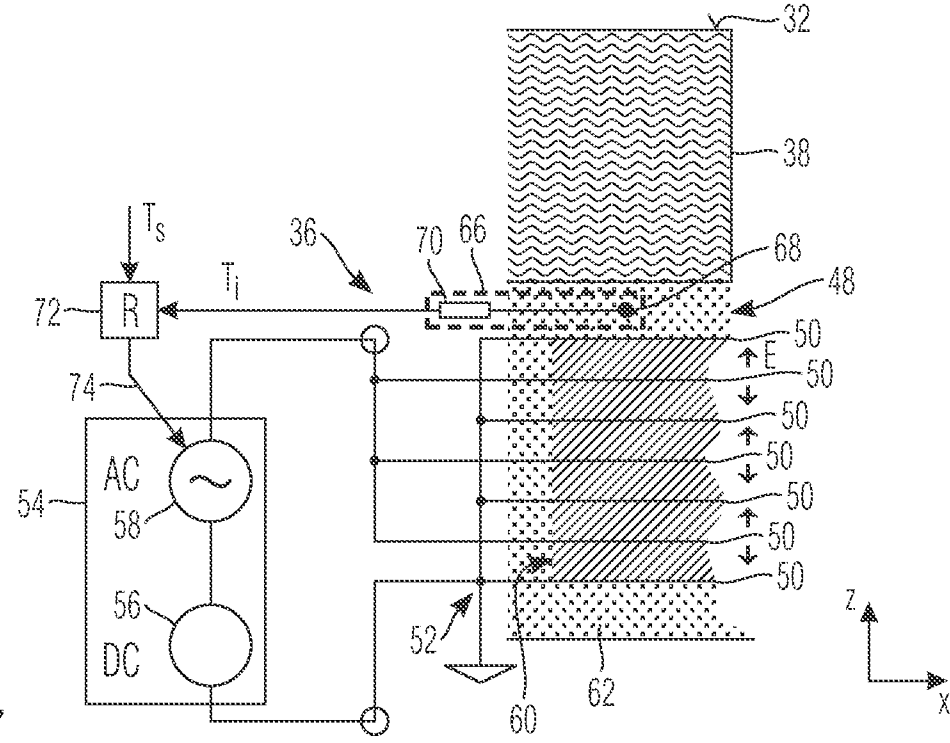
Fig. 7

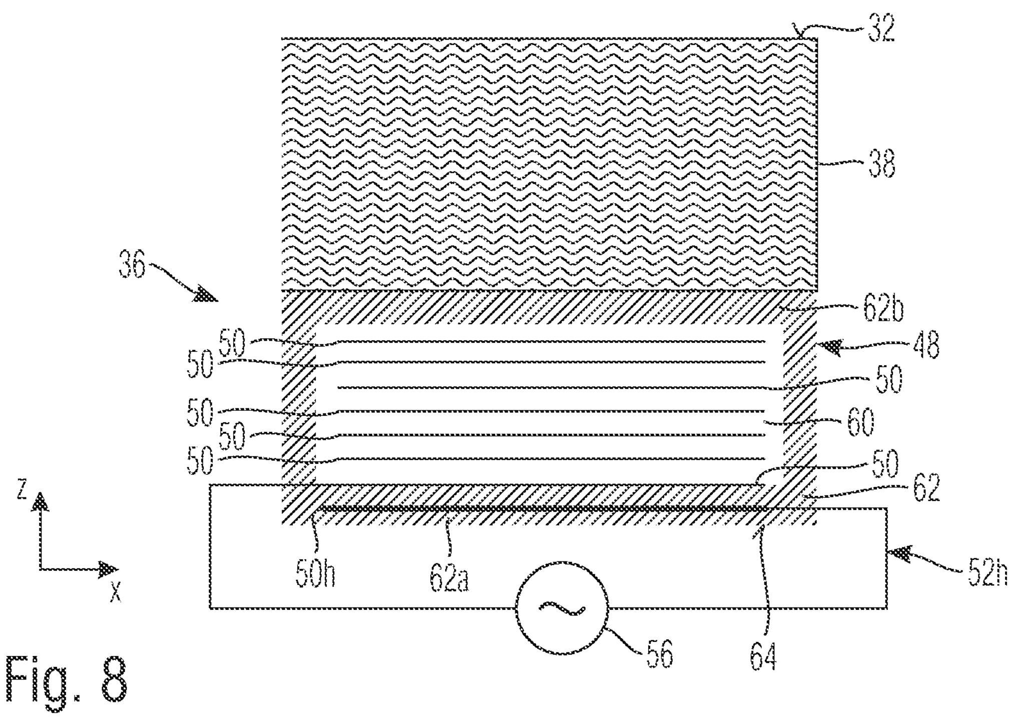
Fig. 8
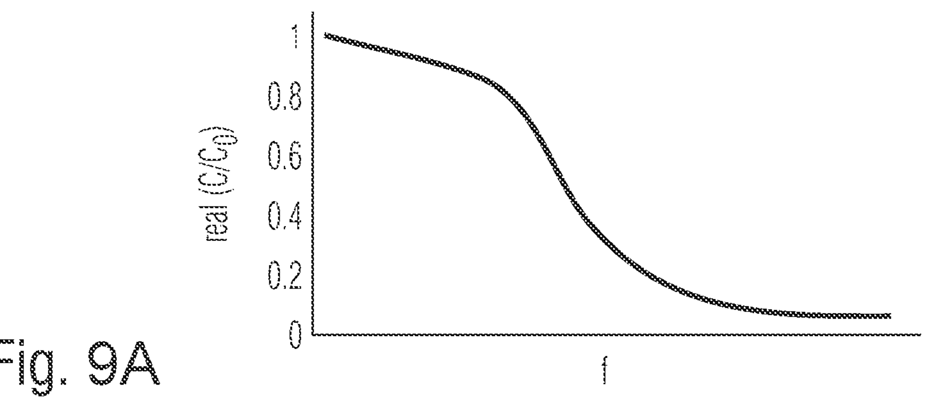
Fig. 9A
Fig. 9B

ADAPTIVE OPTICAL ELEMENT FOR MICROLITHOGRAPHY

CROSS-REFERENCE TO RELATED APPLICATIONS

The present application is a continuation of, and claims benefit under 35 USC 120 to, international application PCT/EP2021/077484, filed Oct. 6, 2021, which claims benefit under 35 USC 119 of German Application No. 10 2020 212 742.5, filed Oct. 8, 2020. The entire disclosure of each of these applications is incorporated by reference herein.

FIELD

The disclosure relates to an adaptive optical element for microlithography, the adaptive optical element comprising at least one manipulator for changing the shape of an optical surface of the optical element, a microlithographic projection exposure apparatus comprising at least one such adaptive optical element and a method for operating such an adaptive optical element.

BACKGROUND

A projection lens with wavefront aberrations that are relatively small is often desired to help make imaging the mask structures on the wafer relative precise. Therefore, projection lenses can be equipped with manipulators, which can render it possible to correct wavefront errors by changing the state of individual optical elements of the projection lens. Examples of such a change in state comprise a change of relative position in one or more of the six rigid-body degrees of freedom of the relevant optical element and a deformation of the optical element. For the purposes of the latter change in state, the optical element is embodied, in general, in the form of an adaptive optical element, which can comprise piezoelectric or electrostrictive manipulators for the purposes of actuating the optical surface. The functionality of such manipulators is often based on the deformation of a dielectric medium by the application of an electric field. To determine the desired change in state, the aberration characteristic of the projection lens is usually measured regularly and, if appropriate, changes in the aberration characteristic between the individual measurements are determined by simulation. In this regard, for example, lens element heating effects can be taken into account computationally.

When using piezoelectric or electrostrictive adaptive optical elements, temperature variations in the actuator material can lead to significant inaccuracies in the surface shape corrections carried out by the adaptive optical element.

SUMMARY

The disclosure seeks to provide an improved adaptive optical element and a method for operating an adaptive optical element and, for example, allow a surface shape correction of the adaptive optical element to be implemented with an improved accuracy.

According to an aspect, the disclosure provides an adaptive optical element for microlithography comprising at least one manipulator for changing the shape of an optical surface of the optical element. The manipulator comprises: a one-piece dielectric medium which is deformable by applying an electric field; electrodes that are arranged in interconnection with the one-piece dielectric medium; and a voltage generator which is wired to the electrodes and configured to apply to the electrodes, firstly, a control voltage that serves to change a longitudinal extent of the dielectric medium and, secondly, an AC voltage that serves to heat the dielectric medium.

The one-piece dielectric medium is understood to mean a contiguous and seamless monolithic dielectric medium, i.e., possibly present connections between various volume portions of the dielectric medium are seamless. By way of example, a seamless connection is understood to mean a connection that was generated by sintering but not a connection generated by adhesive bonding. That is to say, individual volume regions of the dielectric medium cannot be separated from one another without altering or destroying the material structure in the separation region.

Electrodes that are arranged in interconnection with the one-piece dielectric medium should be understood to mean, for example, electrodes that are embedded into the dielectric medium, i.e., surrounded by the dielectric medium, and/or electrodes arranged at the surface of the dielectric medium. The functions of extension and heating are both implemented within the same contiguous dielectric medium.

As a result of the provision according to the disclosure of a voltage generator, which is wired and configured to provide an AC voltage that serves to heat the dielectric medium, it is possible to keep an operating temperature in the dielectric medium constant at a specified temperature or to set the temperature to a defined value. This can help prevent the temperature in the dielectric medium of the manipulator varying over time on account of an inhomogeneous radiation influx on the optical element occurring during the exposure operation. This in turn can help prevent the accuracy of the sought-after surface correction of the adaptive optical element suffering on account of temperature dependencies of the deformation deflection of the dielectric medium.

According to an embodiment, the adaptive optical element furthermore comprises wiring for the electrodes which is configured such that both the control voltage and the AC voltage are applicable at least between the electrodes of an electrode pair. According to an embodiment variant, it is possible to apply both the control voltage and the AC voltage between the electrodes of several, in particular a plurality of or all, electrode pairs.

According to a further embodiment, the voltage generator is furthermore configured to generate within the dielectric medium the AC voltage at such a high frequency that a vibration amplitude of a deformation of the dielectric medium generated thereby is damped by at least one order of magnitude in relation to a deformation of the dielectric medium generated via a corresponding static voltage.

According to an aspect, the disclosure provides an adaptive optical element for microlithography comprising at least one manipulator for changing the shape of an optical surface of the optical element. The manipulator comprises: a dielectric medium which is deformable by the application of an electric field; and a voltage generator which is configured to generate within the dielectric medium an AC voltage which serves to heat the dielectric medium at such a high frequency that a vibration amplitude of a deformation of the dielectric medium generated thereby is damped by at least one order of magnitude, such as by at least a factor of 20, at least a factor of 50 or at least a factor of 100, in relation to a deformation of the dielectric medium generated via a corresponding static voltage. A corresponding static voltage should be understood to mean a voltage which has a voltage value that corresponds to the amplitude of the AC voltage.

According to an embodiment, the voltage generator is configured to generate an AC voltage at a frequency of at least 1 kHz, such as at least 10 kHz, at least 100 kHz, at least 200 kHz or at least 500 kHz.

According to a further embodiment, the dielectric medium comprises an electrostrictive material, in which a deformation occurring as a result of the application of the electric field is independent of the direction of the electric field. In this text, the electrostrictive effect is understood to mean the component of a deformation of a dielectric medium based on an applied electric field, in which the deformation is independent of the direction of the applied electric field and, for example, proportional to the square of the electric field. In contrast thereto, the linear response of the deformation to the electric field is referred to as piezoelectric effect. According to an embodiment variant, the electrostrictive effect dominates over a possible piezoelectric effect in the dielectric medium.

According to a further embodiment, the dielectric medium comprises a piezoelectric material, in which a deformation occurring as a result of the application of the electric field is proportional to the direction of the electric field. According to an embodiment variant, the piezoelectric effect dominates over a possible electrostrictive effect in the dielectric medium.

According to a further embodiment, the electrodes are arranged in the form of a stack of at least three electrodes, for example in the form of a stack of at least four, five or at least six electrodes, in the dielectric medium. According to an embodiment variant, the electrodes are wired in such a way that it is possible to apply the AC voltage between two electrodes of the stack in each case.

According to a further embodiment, at least one of the electrodes is arranged outside of an active volume of the dielectric medium, in which the longitudinal extension occurs during the manipulator operation, and is wired to another electrode for applying the AC voltage. For example, the further electrode is likewise arranged outside of the active volume. According to an embodiment variant, the electrode arranged outside of the active volume is arranged in the region of a surface of the dielectric medium. In particular, this electrode is covered at least by a layer of the dielectric medium that forms the surface.

According to a further embodiment, the at least one manipulator is deformable by applying the electric field parallel to the optical surface. According to a further embodiment, the at least one manipulator is deformable by applying the electric field perpendicular to the optical surface.

According to a further embodiment, the adaptive optical element comprises a plurality of manipulators, such as at least 3, at least 5 or at least 10 manipulators, of the aforementioned type.

According to a further embodiment, the optical surface is configured for the reflection of EUV radiation.

According to a further embodiment, the adaptive optical element furthermore comprises a temperature measuring device for measuring a temperature present in the dielectric medium. According to an embodiment variant, the temperature measuring device is configured to determine a temperature present in the dielectric medium by measuring an electrical capacitance therein. According to a further embodiment variant, the temperature measuring device comprises a different type of temperature sensor, for instance a piezoelectric temperature sensor, for measuring the temperature in the dielectric medium.

According to a further embodiment, the adaptive optical element furthermore comprises a control unit which is configured to control an amplitude and/or frequency of the AC voltage for heating the dielectric medium. In this case, the heating power can be implemented by varying the voltage amplitude at an unchanging frequency according to a first embodiment variant, by varying the frequency at an unchanging voltage amplitude according to a second embodiment variant or by suitably varying both the voltage amplitude and the frequency according to a third embodiment variant.

For example, the control unit can be configured to control the amplitude and/or frequency of the AC voltage on the basis of a temperature measurement in the dielectric medium. To this end, the control unit can comprise a controller embedded in a control loop, in which the temperature in the dielectric medium determined via the above-described temperature measuring device serves as a controlled variable, a specified target temperature serves as reference variable, the amplitude and/or frequency of the AC voltage serves as manipulated variable and the dielectric medium serves as controlled system. Closed-loop control then can serve to adjust the manipulated variable in the form of the frequency and/or the AC voltage, in such a way that the temperature in the dielectric medium adjusts to the target temperature.

Furthermore, according to the disclosure, a microlithographic projection exposure apparatus comprising at least one adaptive optical element according to any one of the above-described embodiments or embodiment variants is provided. According to an embodiment, the adaptive optical element is part of a projection lens of the projection exposure apparatus. Alternatively, the adaptive optical element can also be part of an illumination optical unit of the projection exposure apparatus.

An aspect of the disclosure provides a method of operating an adaptive optical element of a microlithographic projection exposure apparatus for changing the shape of an optical surface of the optical element via at least one manipulator. This method comprises the steps of: providing the manipulator with a one-piece dielectric medium which is deformable by applying an electric field and which comprises electrodes that are arranged in interconnection with the one-piece dielectric medium; applying a control voltage to the electrodes for changing a longitudinal extent of the dielectric medium; and applying an AC voltage to the electrodes for heating the dielectric medium. The AC voltage can be controlled such that the dielectric medium is heated to a specified temperature.

According to an embodiment, heating of the dielectric medium is controlled by varying an amplitude and/or frequency of the AC voltage applied to the electrodes.

According to a further embodiment, the adaptive optical element comprises at least one further manipulator that is heatable via an AC voltage, and the AC voltage applied to the electrodes of the first manipulator and the AC voltage for heating the further manipulator are controlled in such a way that the temperatures of the manipulators equalize.

According to an aspect, the disclosure provides a method of operating an adaptive optical element of a microlithographic projection exposure apparatus for changing the shape of an optical surface of the optical element via at least one manipulator. This method comprises the steps of: providing the manipulator with a dielectric medium which is deformable by applying an electric field; and generating within the dielectric medium an AC voltage at such a high frequency that a vibration amplitude of a deformation of the dielectric medium generated thereby is damped by at least one order of magnitude in relation to a deformation of the dielectric medium generated via a corresponding static voltage.

According to an embodiment, a temperature is determined by measuring an electrical capacitance in the dielectric medium. For example, the AC voltage is controlled on the basis of the determined temperature such that a specified temperature is set in the dielectric medium.

The features specified with respect to the aforementioned embodiments, exemplary embodiments or embodiment variants, etc., of the adaptive optical element according to the disclosure as per one of the inventive aspects can be correspondingly applied to the method according to the disclosure as per one of the inventive aspects, and vice versa. These and other features of the embodiments according to the disclosure are explained in the description of the figures and in the claims. The individual features can be implemented, either separately or in combination, as embodiments of the disclosure. Furthermore, they can describe embodiments which are independently protectable and protection for which is claimed if appropriate only during or after pendency of the application.

BRIEF DESCRIPTION OF THE DRAWINGS

The above and further features of the disclosure are illustrated in the following detailed description of exemplary embodiments according to the disclosure with reference to the accompanying schematic drawings. In the drawings:

FIG. 1 shows an embodiment of a microlithographic projection exposure apparatus comprising an adaptive optical element;

FIG. 2 shows a first embodiment of the adaptive optical element in an initial state and in a corrected state;

FIG. 3 shows a further embodiment of the adaptive optical element in an initial state and in a corrected state;

FIG. 4 shows a diagram which for a manipulator of the adaptive optical element elucidates a strain S as a function of an applied electric field E for different temperatures $\vartheta$;

FIG. 5 shows a diagram which for the manipulator of the adaptive optical element elucidates a strain S as a function of the temperature $\vartheta$;

FIG. 6 shows an exemplary temperature distribution along a plurality of manipulators of the adaptive optical element as per FIG. 3;

FIG. 7 shows a first embodiment of a manipulator of the adaptive optical element;

FIG. 8 shows a second embodiment of a manipulator of the adaptive optical element;

FIG. 9A shows an exemplary curve of the real part of the capacitance of the manipulator as a function of the frequency of an applied voltage;

FIG. 9B shows an exemplary curve of the imaginary part of the capacitance of the manipulator as a function of the frequency of an applied voltage;

FIG. 9C shows an exemplary curve of the absolute value of the capacitance of the manipulator as a function of the frequency of an applied voltage;

FIG. 9D shows an exemplary curve of the normalized parallel conductivity of the manipulator as a function of the frequency of an applied voltage; and FIG. 10 shows a further embodiment of a microlithographic projection exposure apparatus comprising an adaptive optical element.

DETAILED DESCRIPTION

In the exemplary embodiments or embodiments or embodiment variants described below, elements which are functionally or structurally similar to one another are provided with the same or similar reference signs as far as possible. Therefore, for understanding the features of the individual elements of a specific exemplary embodiment, reference should be made to the description of other exemplary embodiments or the general description of the disclosure.

In order to facilitate the description, a Cartesian xyz-coordinate system is indicated in the drawing, from which system the respective positional relationship of the components illustrated in the figures is evident. In FIG. 1, the y-direction extends perpendicularly to the plane of the drawing into the plane, the x-direction extends toward the right, and the z-direction extends upward.

Figures 9C, 9D, 10:
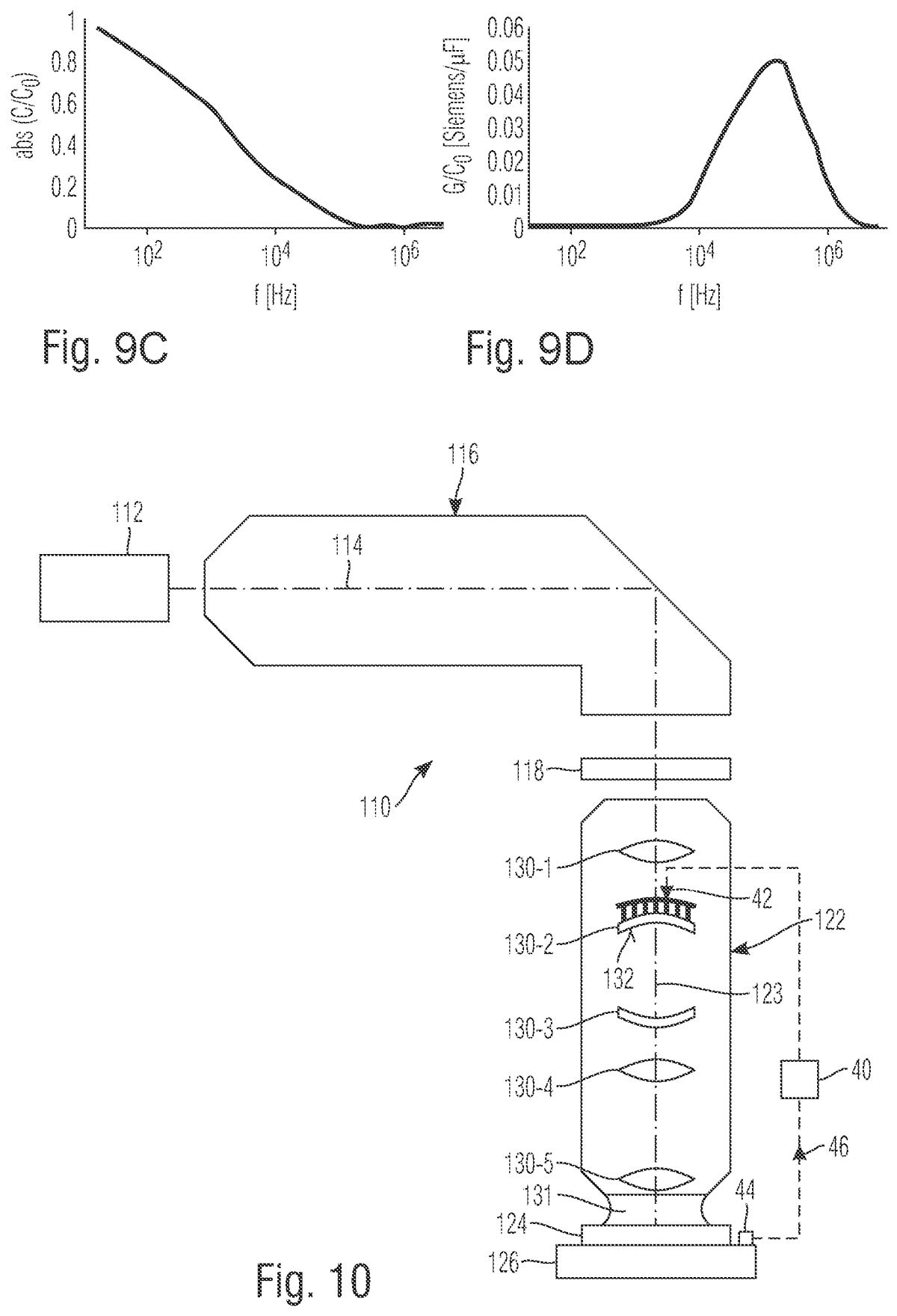

FIG. 1 shows an embodiment according to the disclosure of a microlithographic projection exposure apparatus 10. The present embodiment is designed for operation in the EUV wavelength range, i.e., with electromagnetic radiation having a wavelength of less than 100 nm, in particular a wavelength of approximately 13.5 nm or approximately 6.8 nm. All optical elements are embodied as mirrors as a result of this operating wavelength. However, the disclosure is not restricted to projection exposure apparatuses in the EUV wavelength range. Further embodiments according to the disclosure are designed, for example, for operating wavelengths in the UV range, such as, e.g., 365 nm, 248 nm or 193 nm. In this case, at least some of the optical elements are configured as conventional transmission lens elements. A projection exposure apparatus configured for operation in the DUV wavelength range is described below with reference to FIG. 10.

The projection exposure apparatus 10 in accordance with FIG. 1 comprises an exposure radiation source 12 for generating exposure radiation 14. In the present case, the exposure radiation source 12 is embodied as an EUV source and it can comprise, for example, a plasma radiation source. The exposure radiation 14 initially passes through an illumination optical unit 16 and it is deflected onto a mask 18 thereby.

The mask 18 has mask structures to be imaged on a substrate 24 and it is displaceably mounted on a mask displacement stage 20. The substrate 24 is displaceably mounted on a substrate displacement stage 26. As depicted in FIG. 1, the mask 18 can be embodied as a reflection mask or, alternatively, it can also be configured as a transmission mask, in particular for UV lithography. In the embodiment according to FIG. 1, the exposure radiation 14 is reflected at the mask 18 and thereupon passes through a projection lens 22 configured to image the mask structures onto the substrate 24. The substrate 24 is displaceably mounted on a substrate displacement stage 26. The projection exposure apparatus 10 can be designed as a so-called scanner or a so-called stepper. The exposure radiation 14 is guided within the illumination optical unit 16 and the projection lens 22 via a multiplicity of optical elements, presently in the form of mirrors.

In the illustrated embodiment, the illumination optical unit 16 comprises four optical elements 30-1, 30-2, 30-3 and 30-4 in the form of reflective optical elements or mirrors. The projection lens 22 likewise comprises four optical elements 30-5, 30-6, 30-7 and 30-8, which are likewise in the form of reflective elements or mirrors. The optical elements 30-1 to 30-8 are arranged in an exposure beam path 28 of the projection exposure apparatus 10 for the purposes of guiding the exposure radiation 14.

In the embodiment shown, the optical element 30-5 is configured as an adaptive optical element which has an active optical surface 32 in the form of its mirror surface, the shape of which can be actively changed for the purposes of correcting local shape defects. In further embodiments, a different optical element or a plurality of the optical elements 30-1, 30-2, 30-3, 30-4, 30-5, 30-6, 30-7 and 30-8 can also each be configured as an adaptive optical element.

Furthermore, one or more of the optical elements 30-1, 30-2, 30-3, 30-4, 30-5, 30-6, 30-7 and 30-8 of the projection exposure apparatus 10 can be movably mounted. To this end, a respective rigid body manipulator is assigned to each of the movably mounted optical elements. By way of example, the rigid body manipulators each facilitate a tilt and/or a displacement of the assigned optical elements substantially parallel to the plane in which the respective reflective surface of the optical elements lies. Hence, the position of one or more of the optical elements can be changed for the purposes of correcting imaging aberrations of the projection exposure apparatus 10.

According to one embodiment, the projection exposure apparatus 10 comprises a control device 40 for generating control signals 42 for the manipulation units provided, such as the aforementioned rigid body manipulators, of one or more adaptive optical elements and/or possibly further manipulators. In FIG. 1, the transmission of a control signal 42 to the adaptive optical element 30-5 is elucidated in exemplary fashion. According to an embodiment for correcting aberrations of the projection lens 22, the control device 40 ascertains the control signals 42 on the basis of wavefront deviations 46 of the projection lens 22, measured via a wavefront measuring device 44, via a feedforward control algorithm.

A first embodiment of the adaptive optical element 30-5 is elucidated in FIG. 2. The illustration in the upper section of FIG. 2 shows the adaptive optical element 30-5 in an initial state, in which the shape of the optical surface 32 has an initial shape, a plane shape in this case. The illustration in the lower section of FIG. 2 shows the adaptive optical element 30-5 in a corrected state, in which the shape of the optical surface 32 has a changed shape, a convexly arched shape in this case.

The adaptive optical element comprises a support element 34 in the form of a back plate and a mirror element 38, the surface of which forms the active optical surface 32 and serves to reflect the exposure radiation 14. A multiplicity of manipulators 36, which are also referred to as actuators, are arranged along the bottom of the mirror element 38. Here, these can be positioned both along the x-direction and along the y-direction, i.e., in a two-dimensional arrangement, along the bottom of the mirror element 38. The manipulators 36, only a few of which have been provided with a reference sign in FIG. 2 for reasons of clarity, connect the support element 34 to the mirror element 38. The manipulators 36 are configured to change their extent along their longitudinal direction in the case of actuation. In the embodiment according to FIG. 2, the manipulators 36 are actuatable across or perpendicular to the optical surface 32. The manipulators are each driven individually and can therefore be actuated independently of one another.

In the corrected state shown in the lower section of FIG. 2, centrally arranged manipulators 36 have an increased length on account of their actuation, and so the convexly arched shape arises for the optical surface 32.

FIG. 3 elucidates a further embodiment of the adaptive optical element 30-5. In a manner analogous to FIG. 2, the illustration in the upper section of FIG. 3 shows the adaptive optical element 30-5 in an initial state, in which the shape of the optical surface 32 has a plane shape as initial shape. The illustration in the lower section of FIG. 3 shows the adaptive optical element 30-5 in a corrected state, in which the shape of the optical surface 32 has a convexly curved and hence a changed shape.

The adaptive optical element 30-5 as per FIG. 3 differs from the embodiment as per FIG. 2 to the extent that the manipulators 36 are arranged on the bottom of the mirror element 38 not transverse but parallel to the optical surface 32 and the manipulators 36 are not carried by a rigid support element arranged parallel to the mirror element 38. That is to say, the manipulators 36 are deformable not transverse to the optical surface 32, as in FIG. 2, but parallel to the optical surface 32. As a result of the strain or contraction of the individual manipulators 36 parallel to the surface, a bending moment is introduced into the mirror element 38, leading to deformation of the latter as elucidated in the lower section of FIG. 3.

By driving each individual manipulator 36, it is possible both in the embodiment as per FIG. 2 and in the embodiment as per FIG. 3 to set profiles of the mirror element 38 in a targeted fashion and consequently correct the optical system, in particular the projection lens 22 or the illumination optical unit 16, of the projection exposure apparatus 10 to the best possible extent.

The manipulators 36 of the adaptive optical element 30-5 each comprise a dielectric medium 48 (see FIGS. 7 and 8), which is deformable by the application of an electric field. This can be a piezoelectric material or an electrostrictive material. The deformation is based on the piezoelectric effect in the case of a piezoelectric material, while it is based on the electrostrictive effect in the case of an electrostrictive material. In this text, the electrostrictive effect is understood to mean the component of a deformation of a dielectric medium based on an applied electric field, in which the deformation is independent of the direction of the applied field and, in particular, proportional to the square of the electric field. In contrast thereto, the linear response of the deformation to the electric field is referred to as piezoelectric effect.

In the embodiment variant described below, the manipulators 36 are based on the electrostrictive effect. These are particularly well suited to correcting the shape of the active optical surface 32 since these have a very small drift and exhibit only a minor hysteresis. However, the strain S of these manipulators 36 or actuators is very temperature dependent. In the illustration of FIGS. 7 and 8, the strain S relates to the extension of the dielectric medium 48 in the z-direction. To a first approximation, the strain S can be described by the electrostrictive coefficient M which leads to a strain as a result of the application of an electric field E. As is evident from Formula (1) below, this coefficient depends on the temperature of the dielectric medium 48. Moreover, the strain S of the dielectric medium 48 depends on its stiffness s and the applied mechanical tension T:

$$S(E,\vartheta) = M(\vartheta)\cdot E^2 + s\cdot T + CTE\cdot(\vartheta-\vartheta_0) \tag{1}$$

This effect is elucidated in FIG. 4 on the basis of a schematic S-E diagram for different temperatures $\vartheta(\vartheta_3>\vartheta_2>\vartheta_1)$.

As elucidated in FIG. 5, the dielectric medium moreover significantly extends when the temperature $\vartheta$ changes in relation to the nominal temperature $\vartheta_0$ on account of the coefficient of thermal expansion (CTE) of the medium.

The temperature in individual manipulators 36 can vary significantly on account of locally different heat influx into the mirror element 38 of the adaptive optical element 30-5 during an exposure operation of the projection exposure apparatus 10. FIG. 6 elucidates, in exemplary fashion, a temperature distribution along the manipulators 36 as per FIG. 3 without the inventive heating measure via an AC voltage as described in more detail below. In this case, each of the vertical strips in the shown x-ϑ diagram corresponds to one of the manipulators 36 as per FIG. 3.

The measure according to the disclosure described below facilitates closed-loop control of the temperature of the individual manipulators 36 on an individual basis by generating thermal energy within the dielectric medium 48 using an AC voltage, and hence the temperature being kept at a given temperature. Hence, the complex influence of a changing temperature on the extension S of the dielectric medium 48, as elucidated in FIGS. 4 and 5, can be largely masked, as a result of which the control of the adaptive optical element 30-5 is significantly simplified.

FIG. 7 elucidates a first embodiment according to the disclosure of a manipulator 36 contained in the adaptive optical element 30-5 as per FIG. 2 or FIG. 3. This manipulator 36 comprises the dielectric medium 48, which was already mentioned above and which rests against the back side of the mirror element 38, electrodes 50, wiring 52 of the electrodes 50, and a voltage generator 54. The dielectric medium 48 has a one-piece embodiment in the form of a ceramic part, with the electrodes 50 being embedded or integrated therein. The one-piece dielectric medium 48 is a contiguous and joint-free monolithic dielectric medium and is generated by sintering, for example.

Expressed differently, the electrodes 50 are arranged in an assemblage with the one-piece dielectric medium 48. The electrodes 50 are contained in the dielectric medium 48 in the form of an electrode stack. In the embodiment shown, the electrode stack contains seven plate-shaped electrodes 50 arranged one above the other. The whole area of the dielectric medium 48 arranged between electrodes 50 is referred to as the active volume 60 of the dielectric medium 48. The region of the dielectric medium 48 arranged outside of the electrode stack is accordingly referred to as inactive volume 62. In the embodiment shown, the inactive volume 62 completely surrounds the active volume 60.

The wiring 52 of the electrodes 50 alternately connects the latter to the plus and the minus terminal of a DC voltage source 56 of the voltage generator 54, and so the electric field generated in each case between two adjacent electrodes 50 likewise alternates. Since the dielectric medium 48 is an electrostrictive material in the present case, the extension of the dielectric medium 48 caused by the electric field is independent of the direction of the electric field, i.e., the change in the extent in the z-direction of the layers of the dielectric medium 48 arranged between the electrodes 50 is directed in the same way. Hence, the length extension of the active volume 60 of the dielectric medium 48 changes in the z-direction when a control voltage generated by the DC voltage source 56 is applied. The absolute value of the change in the length extension depends on the control voltage generated by the DC voltage source 56; according to an embodiment, this value is proportional to the value of the control voltage.

In addition to the DC voltage source 56, the voltage generator 54 comprises an AC voltage source 58. The latter serves to overlay an AC voltage on the control voltage generated by the DC voltage source 56, i.e., the aforementioned AC voltage is generated between two respectively adjacent electrodes 50 in the electrode stack. This AC voltage in each case brings about heating of the portion of the dielectric medium 48 arranged between the respective electrode pair and hence brings about uniform heating of the entire active volume 60.

The amplitude and/or the frequency of the AC voltage can be controlled for the purposes of heating the dielectric medium 48. The mechanism on which the heating is based is explained in more detail below. The heating is controlled via the control unit 72 in the form of a controller which transmits an appropriate control signal 74 to the AC voltage source 58. To this end, the controller is embedded in a control loop, in which an actual temperature $T_i$ in the dielectric medium 48 determined via a temperature measuring device 66 serves as a controlled variable, a specified target temperature $T_s$ serves as reference variable, the amplitude and/or frequency of the AC voltage serves as manipulated variable that is transmitted via the control signal 74 and the dielectric medium 48 serves as controlled system.

In the illustrated embodiment variant, the temperature measuring device 66 comprises a temperature sensor 68 which is embedded in the dielectric medium 48 and which is in the form of a piezoelectric temperature sensor for example, and an evaluation unit 70 for converting the measurement signal emitted by the temperature sensor 68 into a temperature signal which relates to the actual temperature $T_i$ and which can be processed by the control unit 72.

According to a further embodiment variant not illustrated in the drawings, the temperature measuring device is configured to determine a temperature present in the dielectric medium 48 by measuring an electrical capacitance therein. By way of example, this capacitance measurement can be implemented in respect of the capacitance of an arrangement of two adjacent electrodes 50 and the dielectric medium 48 arranged therebetween, as per FIG. 7. In this case, the susceptibility in the dielectric medium 48 depends on the applied actuator voltage, the mechanical tension in the dielectric medium and the temperature. By virtue of creating standardized conditions where no voltage is applied to the actuator and the mechanical tension state is defined constantly, it is possible to determine the temperature from the standard condition capacitance of the actuator following an appropriate calibration.

FIG. 8 elucidates a second embodiment according to the disclosure of a manipulator 36 contained in the adaptive optical element 30-5 as per FIG. 2 or FIG. 3. In a manner analogous to the embodiment as per FIG. 7, this embodiment of the manipulator 36 comprises a dielectric medium 48 which comprises an active volume 60 in which a stack of electrodes 50 is arranged. The electrodes 50 of this stack serve to generate an alternating electric field by applying a control voltage. The control voltage is generated by a DC voltage source 56 and is applied to the electrodes 50 of the active volume 60, for example via the wiring 52 illustrated in FIG. 7.

Like in the embodiment as per FIG. 7, the active volume 60 is surrounded by an inactive volume 62. A further electrode 50*h*, which is also referred to as heating electrode below, is arranged within this inactive volume 62. In the present embodiment, the further electrode 50*h* is arranged in a portion 62*a* of the inactive volume 62 which is positioned on the side of the active volume 50 facing away from the mirror element 38 and it forms an overall stack with the electrodes 50 of the electrode stack arranged in the active volume. Hence, the further electrode 50*h* is arranged in the region of a surface 64 of the dielectric medium. Alternatively, the further electrode 50*h* can also be arranged in the portion 62*b* of the inactive volume 62 that is arranged between the mirror element 48 and the active volume 60.

The further electrode 50*h* is wired to the lowermost electrode 50 of the electrode stack of the active volume 50 via additional wiring 52*h*, which is also referred to as heating wiring, and wired to the AC voltage source 56. Hence, thermal energy can be introduced via the mechanism explained in more detail below into the portion of the dielectric medium 48 arranged between the lowermost electrode 50 and the further electrode 50*h*. This thermal energy propagates through the entire dielectric medium 48 and also heats the active volume 50 of the dielectric medium 48.

According to an embodiment, the AC voltage source 56 is controlled via the control unit 72 and temperature measuring device 66 illustrated in FIG. 7. In the case of the above-described design of the temperature measuring device 66 for measuring an electrical capacitance in the dielectric medium 48, the capacitance measurement can be implemented, for instance, in respect of the capacitance of an arrangement of two adjacent electrodes 50 or 50 and 50*h*, and the dielectric medium arranged therebetween as per FIG. 8.

Below, the mechanism which forms the basis of the heating of the dielectric medium 48 via the applied AC voltage is described. The electrical terminal behaviour of an electrostrictive actuator in the form of the manipulator 36 as per FIG. 7 can be described via its capacitance. The latter is complex in the case of dielectric losses in the active volume 60 of the dielectric medium 48. An exemplary curve of the capacitance C(f) as a function of frequency f of the applied voltage is shown in FIGS. 9A, 9B and 9C. In this case, FIG. 9A shows the real part, FIG. 9B shows the imaginary part and FIG. 9C shows the absolute value of the complex capacitance C(f) which has been normalized to $C_0$, where $C_0$ is the capacitance at f=0 Hz.

The imaginary part of the capacitance represents heat realized in the material on account of the dielectric losses. As per $$G_p(f) = 2\pi f\, imag(C(f)) \tag{2}$$

the imaginary part can be expressed as a parallel conductivity $G_p$ applied in parallel to a lossless capacitor (cf. FIG. 9D). From this, the power loss $L_{loss}$ realized in the actuator immediately emerges as $$L_{loss}(f) = G_p(f) U_{eff}^2(f) \tag{3}$$

Hence, the lost power realized as heat is directly proportional to the effective parallel conductivity $G_p$(f) and proportional to the square of the applied effective AC voltage amplitude $$U_{eff}(f) = \frac{1}{\sqrt{2}} \hat{U}_f.$$

In this case, the applied AC voltage is described by $$U(t) = \hat{U}_f \sin(2\pi f t) \tag{4}$$

where t represents the time, f represents the frequency and $\hat{U}_f$ represents the amplitude.

Proceeding from the normalized parallel conductivity G/$C_0$ as a function of frequency, illustrated in FIG. 9D, it is evident that the power loss increases strongly with the frequency and has a broad maximum in the frequency range around 100 kHz. In the case of a capacitance of 1 μF of the active zone in relation to the dielectric heating (corresponds to the active volume 60 in the exemplary embodiment as per FIG. 7 or the volume arranged between the lowermost electrode 50 and the electrode 50*h* in the exemplary embodiment as per FIG. 8), a heating power of approximately 60 mW is achieved in the maximum around 100 kHz via an effective amplitude of the AC voltage of 1 V. In the case of an AC voltage amplitude of 2 V, the heating power increases fourfold to already 240 mW.

The heating power in the dielectric medium 48 itself which is used for thermal closed-loop control is generated by utilizing the dielectric losses in the material. The method denoted below as dielectric heating principle can be operated at frequencies in the region of the broad loss maximum. In the example shown in FIGS. 9A to 9D, this corresponds to a frequency range between 1 kHz and a few MHz. In the process, the AC voltage can be generated at such a high frequency that a vibration amplitude of a deformation or deflection S generated in the z-direction thereby is damped, i.e. smaller, by at least one order of magnitude in relation to a deformation of the dielectric medium 48 generated via a corresponding static voltage (i.e., frequency=0 Hz).

On account of the electrostriction, repolarisation in the dielectric medium 48 is connected to a deflection S in a manner corresponding to the constitutive actuator equation $$S(U) = a P^2(U) \tag{5}$$

In this case, a represents the material- and geometry-specific coupling constant and P represents the dielectric polarization. The following applies to the capacitance of an actuator as per FIG. 7 configured as a multilayer plate capacitor:

$$C(U) = N_L A \chi_f(U),\ \chi_f(U) = \frac{dP(U)}{dU}, \tag{6}$$

where A is the electrode area and $N_L$ is the number of layers. $\chi_f$(U) denotes the dielectric susceptibility, which is generally frequency dependent. In the case of the simultaneous application of an actuation voltage $U_b$ and AC voltage with a small amplitude $\hat{U}$ to the actuator for the purposes of heating as per $$U(t) = U_b + \hat{U}_f \sin(2\pi f t) \tag{7}$$

the following expression arises for the deflection S according to a first-order Taylor expansion:

$$S(t) = a P^2(U_b) + 2a P^2(U_b)\chi_f(U_b)\hat{U}_f \sin(2\pi f t). \tag{8}$$

The absolute value of the amplitude of the extension that modulates with the AC voltage explicitly is:

$$|S_f| = 2aP(U_b)|\chi_f(U_b)|\hat{U}_f. \quad (9)$$

In the case of the dielectric heating of the actuator in the form of the dielectric medium 48, more precisely heating of the active volume 60 of the dielectric medium 48, there should ideally be no modulating extension of the actuator in the case of AC voltage. According to Equation (9), this is given if either the polarization $P(U_b)$ or the susceptibility $\chi_f(U_b)$ either disappears or assumes sufficiently small values. Therefore, in general, there are the two options that are denoted by i) and ii) below for suppressing the effect of the heating voltage on the actuation.

According to option i), the work point $U_b$ is chosen such that no polarization occurs:

$$P(U_b) = 0 \Rightarrow U_b = 0 \quad (10)$$

This variant is implemented in the embodiment already explained above in relation to FIG. 8. In this case, a separate electrode is introduced into the layer stack of the actuator by way of the electrode **50*h***, only the AC voltage but no bias voltage being applied to the latter. No static polarization is formed and hence no modulation of the strain in the linear regime either.

According to option ii) for suppressing the effect of the heating voltage on the actuation, the work frequency f is chosen to be so high that the dielectric and the coupled mechanical system can no longer follow:

$$|\chi_f(U_b)| \rightarrow 0 \Rightarrow f > f_c \quad (11)$$

That is to say, a value that is higher than a reaction frequency $f_c$ is chosen for the work frequency.

As already mentioned above with reference to FIG. 7, the reaction frequency $f_c$ is chosen in such a way according to one embodiment that a vibration amplitude of a deformation of the dielectric medium 48 generated via the AC voltage is damped by at least one order of magnitude, i.e., to less than 10%, in relation to a deformation generated via a corresponding static voltage. According to the embodiment variant illustrated in FIG. 9C, this applies to a reaction frequency $f_c$ of approximately 100 kHz. There is a damping to less than approximately 1% in the case of a reaction frequency of approximately 200 kHz.

As already mentioned above, it is also possible to obtain the desired information which facilitates a temperature control of the actuator by way of a simultaneous measurement of the capacitance in the dielectric medium 48.

FIG. 10 shows a schematic view of a projection exposure apparatus 110 configured for operation in the DUV wavelength range and comprising an illumination optical unit in the form of a beam-shaping and illumination system 116 and comprising a projection lens 122. In this case, DUV stands for "deep ultraviolet" and denotes a wavelength of the exposure radiation 114 utilized by the projection exposure apparatus 110 of between 100 nm and 250 nm. The beam-shaping and illumination system 116 and the projection lens 122 can be arranged in a vacuum housing and/or be surrounded by a machine room with corresponding drive apparatuses.

The DUV projection exposure apparatus 110 comprises a DUV exposure radiation source 112. By way of example, an ArF excimer laser that emits exposure radiation 114 in the DUV range at, for example, approximately 193 nm may be provided to this end.

The beam-shaping and illumination system 116 illustrated in FIG. 10 guides the exposure radiation 114 to a photomask 118. The photomask 118 is embodied as a transmissive optical element and can be arranged outside the systems 116 and 122. The photomask 118 has a structure of which a reduced image is projected onto a substrate 124 in the form of a wafer or the like via the projection lens 122. The substrate 124 is displaceably mounted on a substrate displacement stage 126.

The projection lens 122 has a number of optical elements 130 in the form of lens elements and/or mirrors for projecting an image of the photomask 118 onto the substrate 124. In the embodiment illustrated, the optical elements 130 comprise lens elements 130-1, 130-4 and 130-5, the mirror 130-3 and the further mirror embodied as adaptive optical element 130-3. In this case, individual lens elements and/or mirrors of the projection lens 122 may be arranged symmetrically in relation to an optical axis 123 of the projection lens 122. It should be noted that the number of lens elements and mirrors of the DUV projection exposure apparatus 110 is not restricted to the number shown. More or fewer lens elements and/or mirrors may also be provided. Furthermore, the mirrors are generally curved on their front side for beam shaping.

An air gap between the last lens element 130-5 and the substrate 124 may be replaced by a liquid medium 131 which has a refractive index of >1. The liquid medium 131 may be for example high-purity water. Such a set-up is also referred to as immersion lithography and has an increased photolithographic resolution. The medium 131 can also be referred to as an immersion liquid.

In the embodiment shown in FIG. 10, the mirror configured as adaptive optical element 130-2 is embodied to allow the shape of its mirror surface 132 to be actively changed for the purposes of correcting local shape defects. The mirror surface is therefore also referred to as active optical mirror surface 132. In this case, the adaptive optical element 130-2 is configured analogously to the adaptive optical element 30-5 described above with reference to FIGS. 1, 2 and 3. All statements made above in respect of the adaptive optical element 30-5 can consequently be transferred to the adaptive optical element 130-2.

In a manner analogous to the projection exposure apparatus 10 as per FIG. 1, the adaptive optical element 130-2 is controlled by control signals 42 which are ascertained via a control device 40 on the basis of wavefront deviations 46 of the projection lens 122 measured via a wavefront measuring device 44. Without loss of generality, FIG. 10 here only shows one actuator device, but it is understood that a multiplicity of actuator devices can be present, each of which is able to be controlled individually by open-loop and/or closed-loop control.

The above description of exemplary embodiments, embodiments or embodiment variants is to be understood to be by way of example. The disclosure effected thereby firstly enables the person skilled in the art to understand the present disclosure and the features associated therewith, and secondly encompasses alterations and modifications of the described structures and methods that are also obvious in the understanding of the person skilled in the art. Therefore, all such alterations and modifications, insofar as they fall within the scope of the disclosure in accordance with the definition in the accompanying claims, and equivalents are intended to be covered by the protection of the claims.

LIST OF REFERENCE SIGNS

10 Projection exposure apparatus
12 Exposure radiation source
14 Exposure radiation
16 Illumination optical unit
18 Mask
20 Mask displacement stage
22 Projection lens
24 Substrate
26 Substrate displacement stage
28 Exposure beam path
30-1, 30-2, 30-3, 30-4, 30-6, 30-7, 30-8 Optical elements
30-5 Adaptive optical element
32 Active optical surface
34 Support element
36 Manipulator
38 Mirror element
40 Control device
42 Control signal
44 Wavefront measuring device
46 Wavefront deviations
48 Dielectric medium
50 Electrodes
50*h* Further electrode
52 Wiring
52*h* Additional wiring
54 Voltage generator
56 DC voltage source
58 AC voltage source
60 Active volume
62 Inactive volume
62*a* Portion of the inactive volume
62*b* Portion of the inactive volume
64 Surface of the dielectric medium
66 Temperature measuring device
68 Temperature sensor
70 Evaluation unit
72 Control unit
74 Control signal
110 Projection exposure apparatus
112 Exposure radiation source
114 Exposure radiation
116 Beam-shaping and illumination system
118 Photomask
122 Projection lens
123 Optical axis
124 Substrate
126 Substrate displacement stage
130 Optical element
130-1, 130-4, 130-5 Lens element
130-2 Adaptive optical element
130-3 Mirror
131 Liquid medium
132 Active optical mirror surface

What is claimed is:

1. An optical element, comprising:
a manipulator configured to change a shape of an optical surface of the optical element, the manipulator comprising:
a one-piece dielectric medium configured to deform when an electric field is applied thereto;
electrodes interconnected with the one-piece dielectric medium; and
a voltage generator connected to the electrodes,
wherein:
the voltage generator is configured to apply to the electrodes: i) a control voltage configured to change a longitudinal extent of the dielectric medium; and ii) an AC voltage having a frequency of from 100 kHz to 1 MHz to heat the dielectric medium.

2. The optical element of claim 1, further comprising wiring so that both the control voltage and the AC voltage are applicable between the electrodes of an electrode pair.

3. The optical element of claim 1, wherein the voltage generator is configured to generate the AC voltage within the dielectric medium at the frequency so that a vibration amplitude of a deformation of the dielectric medium generated by the AC voltage is damped by at least one order of magnitude relative a deformation of the dielectric medium generated via a corresponding static voltage.

4. The optical element of claim 1, wherein the dielectric medium comprises an electrostrictive material in which a deformation due to the electric field is independent of a direction of the electric field.

5. The optical element of claim 1, wherein the dielectric medium comprises a piezoelectric material in which a deformation due to the electric field is proportional to a direction of the electric field.

6. The optical element of claim 1, wherein the electrodes are disposed in a stack comprising at least three electrodes, and the stack of electrodes is in the dielectric medium.

7. The optical element of claim 6, wherein the electrodes are configured so that the AC voltage is applicable between two electrodes of the stack.

8. The optical element of claim 1, wherein:
during use of the manipulator, the change in the longitudinal extent of the dielectric medium occurs in an active volume of the dielectric medium;
an electrode is outside the active volume of the dielectric medium; and
the electrode is wired to another electrode to apply the AC voltage.

9. The optical element of claim 8, wherein the electrode arranged outside of the active volume is in a region of a surface of the dielectric medium.

10. The optical element of claim 1, wherein the optical surface is configured to reflect EUV radiation.

11. The optical element of claim 1, further comprising a temperature measuring device configured to measure a temperature in the dielectric medium.

12. The optical element of claim 1, further comprising a control unit configured to control an amplitude and/or frequency of the AC voltage for heating the dielectric medium.

13. An apparatus, comprising:
an optical element according to claim 1,
wherein the apparatus is a microlithographic projection exposure apparatus.

14. A method of operating an optical element of a microlithographic projection exposure apparatus to change a shape of an optical surface of the optical element via a manipulator, the method comprising:
providing the manipulator with a one-piece dielectric medium which is deformable by applying an electric field and which comprises electrodes that are arranged in interconnection with the one-piece dielectric medium;
applying a control voltage to the electrodes to change a longitudinal extent of the dielectric medium; and applying an AC voltage having a frequency of from 100 kHz to 1 MHz to the electrodes for heating the dielectric medium.

15. The method of claim 14, further comprising varying an amplitude and/or frequency of the AC voltage applied to the electrodes to heat the dielectric medium.

16. The method of claim 14, wherein:

the optical element comprises a further manipulator that is heatable via an AC voltage; and the AC voltage applied to the electrodes of the manipulator and the AC voltage for heating the further manipulator are controlled so that the temperatures of the manipulators equalize.

17. A method of operating an adaptive optical element of a microlithographic projection exposure apparatus for changing the shape of an optical surface of the optical element via a manipulator, the method comprising:

providing the manipulator with a dielectric medium which is deformable by applying an electric field; and generating an AC voltage having a frequency of from 100 kHz to 1 MHz within the dielectric medium so that a vibration amplitude of a deformation of the dielectric medium generated thereby is damped by at least one order of magnitude in relation to a deformation of the dielectric medium generated by means of a corresponding static voltage.

18. An optical element, comprising:

a manipulator configured to change a shape of an optical surface of the optical element, the manipulator comprising:

a dielectric medium configured to deform when an electric field is applied thereto; and a voltage generator configured to generate an AC voltage having a frequency of from 100 kHz to 1 MHz within the dielectric medium so that a vibration amplitude of a deformation of the dielectric medium generated by the AC voltage is damped by at least one order of magnitude relative to a deformation of the dielectric medium generated via a corresponding static voltage.

19. An apparatus, comprising:

an optical element according to claim 18, wherein the apparatus is a microlithographic projection exposure apparatus.

20. A method of operating an optical element of a microlithographic projection exposure apparatus to change a shape of an optical surface of the optical element via a manipulator, the method comprising:

providing the manipulator with a one-piece dielectric medium which is deformable by applying an electric field and which comprises electrodes that are arranged in interconnection with the one-piece dielectric medium;

applying a control voltage to the electrodes to change a longitudinal extent of the dielectric medium; and applying an AC voltage to the electrodes for heating the dielectric medium, wherein:

the optical element comprises a further manipulator that is heatable via an AC voltage; and the AC voltage applied to the electrodes of the manipulator and the AC voltage for heating the further manipulator are controlled so that the temperatures of the manipulators equalize.

* * * * *